(12) United States Patent
Shin et al.

(10) Patent No.: US 10,468,187 B2
(45) Date of Patent: Nov. 5, 2019

(54) THIN-FILM CERAMIC CAPACITOR HAVING CAPACITANCE FORMING PORTIONS SEPARATED BY SEPARATION SLIT

(71) Applicant: SAMSUNG ELECTRO-MECHANICS CO., LTD., Suwon-si, Gyeonggi-do (KR)

(72) Inventors: Hyun Ho Shin, Suwon-si (KR); Woong Do Jung, Suwon-si (KR); Young Seok Yoon, Suwon-si (KR); Dong Sik Yoo, Suwon-si (KR); No Il Park, Suwon-si (KR); Seung Mo Lim, Suwon-si (KR); Il Ro Lee, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/621,136

(22) Filed: Jun. 13, 2017

(65) Prior Publication Data

US 2018/0040422 A1 Feb. 8, 2018

(30) Foreign Application Priority Data

Aug. 5, 2016 (KR) .................. 10-2016-0099940
Nov. 29, 2016 (KR) .................. 10-2016-0160290

(51) Int. Cl.
*H01G 4/232* (2006.01)
*H01G 4/33* (2006.01)
(Continued)

(52) U.S. Cl.
CPC ............ *H01G 4/232* (2013.01); *H01G 4/008* (2013.01); *H01G 4/30* (2013.01); *H01G 4/33* (2013.01); *H01G 4/385* (2013.01)

(58) Field of Classification Search
CPC ........ H01G 4/1209; H01G 4/232; H01G 4/33; H01G 4/385; H01G 4/12; H01G 4/30; H01G 4/008; H01G 4/228; H01L 28/60
See application file for complete search history.

(56) References Cited

U.S. PATENT DOCUMENTS

| 6,232,133 | B1 * | 5/2001 | Kim | ............... | H01G 4/228 |
| | | | | | 257/E21.664 |
| 6,724,611 | B1 * | 4/2004 | Mosley | ........... | H01G 4/228 |
| | | | | | 257/E27.116 |

(Continued)

FOREIGN PATENT DOCUMENTS

| CN | 101896985 A | 11/2010 |
| CN | 102113113 A | 6/2011 |

(Continued)

OTHER PUBLICATIONS

Office Action issued in Korean Patent Application No. 10-2016-0160290, dated Feb. 19, 2018 (English translation).

(Continued)

*Primary Examiner* — David M Sinclair
(74) *Attorney, Agent, or Firm* — Morgan, Lewis & Bockius LLP

(57) ABSTRACT

A thin-film ceramic capacitor includes a body in which dielectric layers and first and second electrode layers are alternately disposed on a substrate, and first and second electrode pads disposed on external surfaces of the body. A plurality of vias are disposed in the body. Each of a plurality of first vias connects the first electrode layers and the first electrode pad to each other. Each of a plurality of second vias connects the second electrode layers and the second electrode pad to each other. A separation slit is disposed to penetrate from an upper surface of the body and extend to (Continued)

the substrate, and the pluralities of first and second vias are disposed symmetrically with respect to the separation slit.

16 Claims, 7 Drawing Sheets

(51) Int. Cl.
*H01G 4/30* (2006.01)
*H01G 4/38* (2006.01)
*H01G 4/008* (2006.01)

(56) References Cited

U.S. PATENT DOCUMENTS

| | | | |
|---|---|---|---|
| 7,742,314 B2* | 6/2010 | Urashima | H01G 2/06 |
| | | | 174/260 |
| 2003/0136997 A1 | 7/2003 | Shioga et al. | |
| 2004/0130849 A1 | 7/2004 | Kurihara et al. | |
| 2007/0076348 A1* | 4/2007 | Shioga | H01G 4/232 |
| | | | 361/307 |
| 2007/0117338 A1* | 5/2007 | Yamamoto | H01G 4/232 |
| | | | 438/396 |
| 2008/0239685 A1* | 10/2008 | Kawabe | H01G 4/232 |
| | | | 361/782 |
| 2009/0141426 A1* | 6/2009 | Hwang | H01G 4/012 |
| | | | 361/321.2 |
| 2010/0246089 A1 | 9/2010 | Yano et al. | |
| 2011/0075317 A1 | 3/2011 | Oikawa et al. | |
| 2013/0043509 A1* | 2/2013 | Cho | H01L 27/11526 |
| | | | 257/208 |
| 2013/0120902 A1* | 5/2013 | Noguchi | H01G 4/12 |
| | | | 361/303 |
| 2013/0258544 A1* | 10/2013 | Namikawa | H01G 4/306 |
| | | | 361/301.4 |
| 2013/0258545 A1 | 10/2013 | Yano et al. | |
| 2018/0040422 A1 | 2/2018 | Shin et al. | |

FOREIGN PATENT DOCUMENTS

| | | |
|---|---|---|
| CN | 105321716 A | 2/2016 |
| JP | 2000-514243 A | 10/2000 |
| JP | 2003-197463 A | 7/2003 |
| JP | 2007149730 A * | 6/2007 |
| JP | 2008243931 A * | 10/2008 |
| JP | 2008252011 A * | 10/2008 |
| JP | 2011-077151 A | 4/2011 |
| JP | 2011-165776 A | 8/2011 |
| JP | 2013-229582 A | 11/2013 |
| JP | 2015-070058 A | 4/2015 |
| WO | 98/00871 A1 | 1/1998 |
| WO | 2010/016171 A1 | 2/2010 |
| WO | WO-2016158228 A1 * | 10/2016 ............... H01G 4/33 |

OTHER PUBLICATIONS

Office Action issued in corresponding U.S. Appl. No. 16/436,031, dated Jul. 8, 2019.

Office Action issued in corresponding Chinese Application No. 201710627312.9, dated Aug. 27, 2019.

* cited by examiner

I-I'

THIN-FILM CERAMIC CAPACITOR HAVING CAPACITANCE FORMING PORTIONS SEPARATED BY SEPARATION SLIT

CROSS-REFERENCE TO RELATED APPLICATION(S)

This application claims benefit of priority to Korean Patent Applications No. 10-2016-0099940 filed on Aug. 5, 2016 and No. 10-2016-0160290 filed on Nov. 29, 2016 in the Korean Intellectual Property Office, the disclosures of which are incorporated herein by reference in their entireties.

BACKGROUND

1. Field

The present disclosure relates to thin-film ceramic capacitors.

2. Description of Related Art

Recently, efforts have been made to thin portable information technology (IT) products such as smartphones, wearable devices, and the like. As part of these efforts, a need has increased for thinning passive elements in order to decrease an overall thickness of a package.

To this end, demand for thin-film ceramic capacitors capable of implementing a reduced thickness of a package, as compared to a multilayer ceramic capacitor, has also increased.

Such thin-film ceramic capacitors have an advantage in that thin capacitors may be implemented by using thin film technology.

Further, thin-film ceramic capacitors have an advantage of having low equivalent series inductance (ESL), unlike a multilayer ceramic capacitor according to the related art. As such, the application of thin-film ceramic capacitors for use as decoupling capacitors in application processors (APs) has been considered.

In order to use a thin-film ceramic capacitor as the decoupling capacitor in an application processor (AP) as described above, the thin-film ceramic capacitor has been manufactured in a form of a land-side capacitor.

However, in the case of existing embedded-type capacitors, it is difficult to rework or replace the capacitors when defects occur in the capacitors. As a result, entire devices may have to be written off as losses, thereby significantly increasing costs associated with defective capacitors. Therefore, there is a need to implement a thin-film ceramic capacitor in a form of a reworkable land-side capacitor (LSC).

Meanwhile, since the LSC type thin-film ceramic capacitor is disposed between solder balls, the thin-film ceramic capacitor should be designed to be as small as possible to significantly decrease a solder ball removal area.

At the same time, in a capacitor product manufactured using thin film technology, a method of forming vias for connections between an external electrode and an electrode layer and between electrode layers is important. Performance of the thin-film ceramic capacitor is affected by the method of forming the vias as described above and a final structure.

In a method of manufacturing a thin-film ceramic capacitor according to the related art, at the time of forming vias after repeatedly stacking dielectric layers and electrode layers, one via is required for each electrode layer. As a result, the method can require forming the same number of vias as the number of electrode layers.

In addition, as a patterning method at the time of stacking the electrode layers, a method commonly used involves stacking even-numbered electrode layers and odd-numbered electrode layers in different forms and etching one side surface so as to externally expose only even- or odd-numbered electrode layers and then connecting electrodes to each other.

However, these methods have problems in that the associated processes are complicated, thereby resulting in increased manufacturing costs. As a result, a need exists for a technology capable of easily manufacturing a more miniaturized thin-film ceramic capacitor.

SUMMARY

An aspect of the present disclosure may provide a high-capacitance thin-film ceramic capacitor having excellent reliability and a small size.

According to an aspect of the present disclosure, a thin-film ceramic capacitor may include a body in which a plurality of dielectric layers and first and second electrode layers are alternately disposed on a substrate, and first and second electrode pads disposed on external surfaces of the body. A plurality of vias are disposed in the body Among the plurality of vias, each of a plurality of first vias connects the first electrode layers and the first electrode pad to each other and penetrates from one external surface of the body to a lowermost first electrode layer adjacent to the substrate. Among the plurality of vias, each of a plurality of second vias connects the second electrode layers and the second electrode pad to each other and penetrates from one external surface of the body to a lowermost second electrode layer adjacent to the substrate. A separation slit is disposed to penetrate from an upper surface of the body and extend to the substrate, and the pluralities of first and second vias are disposed symmetrically on opposite sides of the separation slit.

According to another aspect of the present disclosure, a thin-film ceramic capacitor may include a body in which a plurality of first and second electrode layers are alternately stacked on a substrate, and in which a dielectric layer is disposed between adjacently stacked first and second electrode layers. First and second electrode pads are disposed on at least one external surface of the body. A plurality of vias are disposed in the body, and a first via connects the first electrode layers and the first electrode pad to each other, the first via has a multi-step shape having a width that increases in a direction from the substrate towards an upper portion of the body, and the width of the first via increases at each first electrode layer and remains constant through each second electrode layer.

According to a further aspect of the present disclosure, a thin-film ceramic capacitor may include a body in which a plurality of first and second electrode layers are alternately stacked on a substrate, and in which a dielectric layer is disposed between adjacently stacked first and second electrode layers. First, second, and third electrode pads are disposed on at least one external surface of the body. A separation slit is disposed to penetrate from an upper surface of the body and extend to the substrate, and the separation slit separates each first and second electrode layer into separate portions. The first electrode pad is connected to each of the first electrode layers disposed on one side of the separation slit, the second electrode pad is connected to each of the first electrode layers disposed on another side of the separation slit, and the third electrode is connected to each of the second electrode layers disposed on at least the one side of the separation slit.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Hereinafter, a thin-film ceramic capacitor according to the present disclosure will be described.

Figure 1:
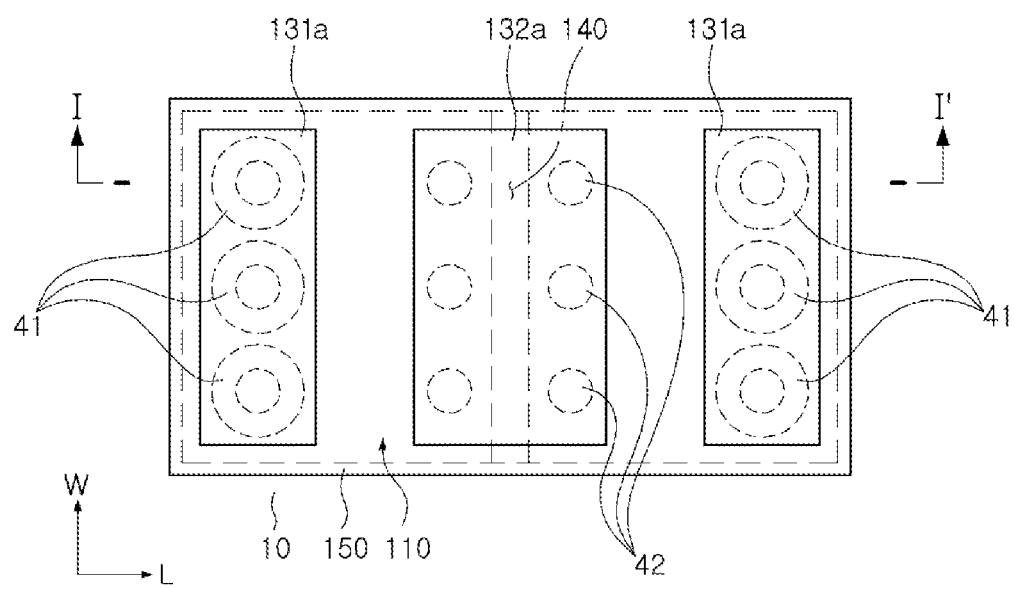
FIG. 1 is a plan diagram illustrating a thin-film ceramic capacitor according to an exemplary embodiment.
Figure 2:
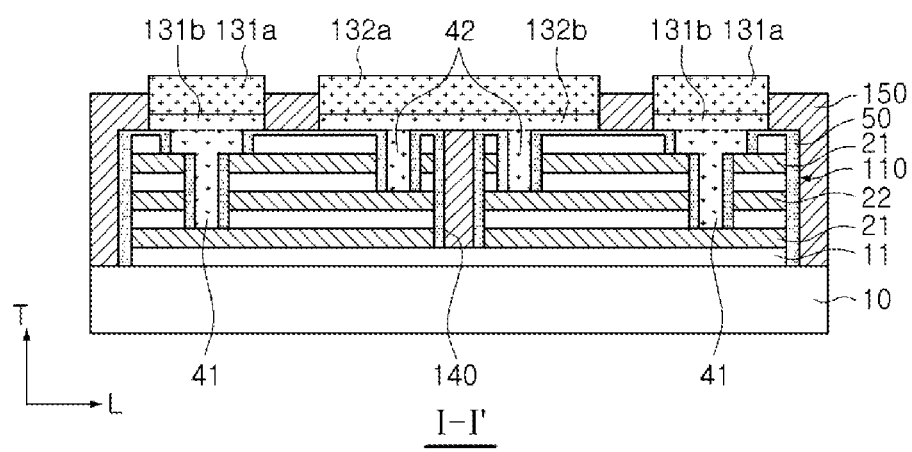
FIG. 2 is a schematic cross-sectional diagram taken along line I-I' of FIG. 1.

FIG. 1 is a plan diagram illustrating a thin-film ceramic capacitor according to an exemplary embodiment, and FIG. 2 is a schematic cross-sectional diagram taken along line I-I' of FIG. 1.

Referring to FIGS. 1 and 2, the thin-film ceramic capacitor according to the exemplary embodiment may include a body 110 formed by alternately stacking first and second electrode layers 21 and 22 on a substrate 10, and interposing dielectric layers 11 between (and above and below) the first and second electrode layers 21 and 22; a plurality of first vias 41 disposed in the body 110 and electrically connected to the first electrode layers 21 and a plurality of second vias 42 disposed in the body 110 and electrically connected to the second electrode layers 22; first and second electrode pads 131a and 132a disposed on external surfaces of the body 110; and a first connection electrode 131b disposed on the outer portion of the body 110 and connecting the first electrode pad 131a and the first via 41 and a second connection electrode 132b disposed on the outer portion of the body 110 and connecting the second electrode pad 132a and the second via 42.

According to the exemplary embodiment, a 'length direction' of the thin-film ceramic capacitor refers to an 'L' direction of FIGS. 1 and 2, a 'width direction' thereof refers to a 'W' direction of FIG. 1, and a 'thickness direction' thereof refers to a 'T' direction of FIG. 2. The 'thickness direction' is the same as a direction in which the dielectric layers and the electrode layers are stacked, that is, the 'stacking direction'.

A shape of the body 110 is not particularly limited, but generally, may be a hexahedral shape. Further, the body 110 is not particularly limited in view of dimensions, but may have, for example, a size of 0.6 mm×0.3 mm and may be a highly stacked and high-capacitance thin-film ceramic capacitor of 1.0 μF or more.

The substrate 10 may be a layer (substrate) contacting the first and second electrode layers 21 and 22, or disposed directly on an opposite side of a dielectric layer 11 contacting the first and second electrode layers 21 and 22. The substrate may be a layer having insulation properties, and may be formed of one selected from $Al_2O_3$, $SiO_2/Si$, MgO, $LaAlO_3$, and $SrTiO_3$, but is not limited thereto. It is preferable that the substrate 10 exhibit sufficient flatness and surface roughness to enable the electrode layers to be formed thereon.

In addition, the substrate 10 may be disposed on a Si wafer.

According to the exemplary embodiment, the body 110 may have a separation slit 140.

The separation slit 140 may penetrate through an upper surface of the body 110 and expose (or extend to) the substrate 10.

According to the exemplary embodiment, the plurality of first and second vias 41 and 42 maybe disposed symmetrically (e.g., mirror-wise) on both sides of the separation slit 140.

That is, the second vias 42 may be disposed on both sides of the separation slit 140 to be adjacent to the separation slit 140, and the first vias 41 may be disposed on both sides of the separation slit 140 adjacently to both end surfaces of the body 110, respectively. Alternatively, the first vias 41 may also be disposed on both sides of the separation slit 140 to be adjacent to the separation slit 140, and the second vias 42 may also be disposed on both sides of the separation slit 140 adjacently to both end surfaces of the body 110, respectively.

According to the exemplary embodiment, the first electrode pads 131a may be disposed to be electrically connected to two vias each disposed adjacently to a respective one of the end surfaces of the body 110, and the second electrode pad 132a may be disposed to be electrically connected to two vias adjacent to the separation slit 140.

The two vias 42 disposed adjacently to the separation slit 140 may have a polarity different from the two vias 41 disposed adjacently to respective end surfaces of the body 110. Additionally, as illustrated in FIG. 2, the two vias adjacent to the separation slit 140 may be disposed as the second vias 42, and two vias disposed adjacently to the end surfaces of the body 110 may be disposed as the first vias 41.

Therefore, the electrode pads disposed to be electrically connected to two first vias 41 disposed adjacently to both end surfaces of the body 110, respectively, may be the first electrode pads 131a, and the electrode pad disposed to be electrically connected to two second vias 42 adjacent to the separation slit 140 may be the second electrode pad 132a.

Referring to FIG. 2, the second electrode pad 132a disposed to be electrically connected to two second vias 42 adjacent to the separation slit 140 may be disposed to cover the separation slit 140.

Further, one terminal of the thin-film ceramic capacitor is disposed as the second electrode pad 132a, such that the thin-film ceramic capacitor according to the exemplary embodiment may have a structure of a three-terminal capacitor.

In general, since in a three-terminal multilayer ceramic capacitor, three external terminals simultaneously connect dielectric layers and internal electrodes, there is a limitation in treating different signals. That is, a three-terminal multilayer ceramic capacitor according to the related art is a component used to decrease ESL by decreasing a distance between terminals, rather than to minimize a mounting surface at the time of mounting the three-terminal multilayer ceramic capacitor on a board.

More specifically, it is difficult to implement and use the three-terminal multilayer ceramic capacitor according to the related art as two separate capacitors. The reason is that signal terminals disposed at both ends share the same internal electrodes.

That is, in a case in which different signals are received in two signal terminals sharing the internal electrodes, it is difficult in devices of the related art to allow the three-terminal multilayer ceramic capacitor to execute proper functions as two capacitors operating independently.

However, since the thin-film ceramic capacitor according to the exemplary embodiment uses a photolithography-etching process, i.e. a type of semiconductor manufacturing process, a pattern having high precision may be formed therein, such that in a case in which different signals are received in two signal terminals, the thin-film ceramic capacitor may execute proper functions as two capacitors operating independently.

According to the exemplary embodiment, a three-terminal thin-film ceramic capacitor in which two capacitors are formed and three terminal electrodes are disposed in a land-side capacitor (LSC) may be provided, such that a mounting surface at the time of mounting the thin-film ceramic capacitor on a board may be significantly decreased.

More specifically, the thin-film ceramic capacitor according to the exemplary embodiment may have a structure in which the separation slit 140 is disposed in the body 110 and formed to penetrate through the upper surface of the body 110 so as to extend to and expose the substrate, and the plurality of first and second vias 41 and 42 are disposed symmetrically on either side of the separation slit 140.

Further, the electrode pads may be composed of two first electrode pads 131a disposed to be electrically connected to two first vias 41 disposed adjacently to both end surfaces of the body 110, respectively, and one second electrode pad 132a disposed to be electrically connected to two second vias 42 adjacent to the separation slit 140, such that the thin-film ceramic capacitor may have a structure of a three-terminal thin-film capacitor.

Here, the first electrode pads 131a may serve as signal terminals, and the second electrode pad 132a may serve as a ground terminal.

According to the exemplary embodiment in the present disclosure, the thin-film ceramic capacitor may have the structure in which the separation slit 140 is disposed in the body 110 and formed to penetrate through the upper surface of the body 110 and extend to (e.g., so as to expose) the substrate, and the plurality of first and second vias 41 and 42 are disposed symmetrically on either side of the separation slit 140, such that two capacitors may be completely separated from each other to thereby function independently. Therefore, even though different signals are received in two signal terminals, two signals do not affect each other, such that the thin-film ceramic capacitor may execute proper functions as two capacitors.

Therefore, since two capacitors to be mounted on the substrate 10 maybe implemented as one capacitor mounted on a board, a board mounting area may be substantially decreased.

Referring to FIG. 2, in the body 110 having a stacking structure in which the first electrode layer 21 is formed on the substrate 10, the dielectric layer 11 is formed on the first electrode layer 21, and the second electrode layer 22 is formed on the dielectric layer 11, the plurality of first and second electrode layers 21 and 22 may be alternately stacked with each of the dielectric layers 11 interposed therebetween. Here, the numbers of stacked dielectric layers and first and second electrode layers are not limited to those in the accompanying drawing: additional or fewer layers may be included without departing from the scope of the disclosure.

The body 110 may be formed by stacking the dielectric layers 11 and the first and second electrode layers 21 and 22 to be alternately disposed on the substrate 10.

In more detail, the body 110 may be formed by stacking the plurality of dielectric layers 11 in the thickness direction and stacking the first and second dielectric layers 21 and 22 simultaneously so as to be alternately disposed with each of the dielectric layers 11 interposed therebetween as illustrated in FIG. 2.

According to the exemplary embodiment, the vias may be formed to have a multi-step shape, that is, a stepped shape by performing interlayer etching while changing an etching area in order to selectively connect internal electrodes of the thin-film ceramic capacitor stacked simultaneously.

In addition, an insulating layer 50 may be formed on an internal electrode to be insulated among the internal electrodes exposed in the via etched in the stepped shape, thereby blocking electrical connection.

Next, after exposing only an electrode to be connected, a seed layer is formed using an electroless plating method or sputtering method, and then, an electrode connection layer may be formed by filling a conductive metal using a plating method.

Therefore, interlayer electrical connection of the internal electrodes may be implemented through one via.

According to the exemplary embodiment, since the thin-film ceramic capacitor is manufactured by stacking the dielectric layers 11 and the first and second electrodes 21 and 22 simultaneously, a damage occurring at the time of exposure to an external environment may be significantly decreased.

As the numbers of stacked first and second electrode layers 21 and 22 and dielectric layers 11 are increased, equivalent series resistance (ESR) of the capacitor may be decreased.

Each of the first and second electrode layers 21 and 22 may be formed as a single layer without a predetermined pattern.

The first and second electrode layers 21 and 22 may be formed of a conductive material.

The conductive material may be copper (Cu), aluminum (Al), gold (Au), silver (Ag), platinum (Pt), iridium (Ir), ruthenium (Ru), or the like, but is not limited thereto.

Formation of the dielectric layer 11, e.g. a thin film having high permittivity, may be accompanied by high-temperature thermal history. Therefore, a problem that a leakage current is increased in the capacitor may occur due to diffusion of the electrode layer into the dielectric layer or a reaction with the dielectric layer.

The first and second electrodes 21 and 22 may be formed of platinum (Pt), a material having a high melting point, such that diffusion into the dielectric layer 11 or the reaction with the dielectric layer 11 may be decreased.

The dielectric layer 11 may contain a perovskite material as a material having high permittivity.

The perovskite material may be a dielectric material of which permittivity may be significantly changed, for example, a barium titanate ($BaTiO_3$) based material, a strontium titanate ($SrTiO_3$) based material, a $(Ba,Sr)TiO_3$ based material, a lead zirconate titanate (PZT) based material, or the like, but is not limited thereto.

The first via 41 may be electrically connected to the first electrode layer 21, the second via 42 may be electrically connected to the second electrode layer 22, and the first and second vias 41 and 42 may be electrically insulated from each other.

The first and second vias 41 and 42 may be formed of a conductive material, and be formed by a plating method. Therefore, depressed portions (dimples) may be formed in upper surfaces of the first and second vias 41 and 42.

The conductive material may be copper (Cu), aluminum (Al), gold (Au), silver (Ag), platinum (Pt), or the like, but is not limited thereto.

The first and second vias 41 and 42 maybe formed in plural. When pluralities of first and second vias 41 and 42 are formed, contact surfaces contacting the first and second electrode layers 21 and 22, respectively, may be increased, such that ESR of the capacitor may be decreased.

The first and second connection electrodes 131b and 132b may be formed to connect the first and second vias 41 and 42 to the first and second electrode pads 131a and 132a, respectively.

The first and second connection electrodes 131b and 132b may be formed of a conductive material, and be formed by a plating method.

The conductive material may be copper (Cu), aluminum (Al), gold (Au), silver (Ag), platinum (Pt), or the like, but is not limited thereto.

The first and second electrode pads 131a and 132a may be formed on the upper surface of the body 110, and connected to the first and second electrode layers 21 and 22 through the plurality of vias 41 and 42 exposed to the upper surface of the body to thereby be electrically connected thereto.

The first and second electrode pads 131a and 132a as described above may be formed on the upper surface of the body 110 by a thin film formation method such as a sputtering method or e-beam deposition method.

The first and second electrode pads may contain a conductive material.

The conductive material may be copper (Cu), aluminum (Al), gold (Au), silver (Ag), platinum (Pt), or the like, but is not limited thereto.

The first and second electrode pads may include seed layers and electrode layers formed from the seed layers, respectively.

Referring to FIG. 2, the first electrode pad 131a may be connected to two first vias 41 disposed adjacently to the end surfaces of the body 110, respectively, to thereby serve as the signal terminal, and the second electrode pad 132a may be connected to two second vias 42 disposed adjacently to the separation slit 140. In a case in which one electrode pad is disposed to cover the separation slit 140 while simultaneously connecting two second vias 42, the second electrode pad 132a may serve as the ground terminal in the three-terminal thin-film ceramic capacitor.

The first and second electrode pads 131a and 132a may be integrated with the first and second connection electrodes 131b and 132b. Alternatively, the first and second electrode pads 131a and 132a may be disposed on the first and second connection electrodes 131b and 132b.

The insulating layer 50 may be formed in order to allow the first and second vias 41 and 42 to be electrically connected to the first and second electrode layers 21 and 22, respectively.

The insulating layer 50 may be formed between the first via 41 and the dielectric layer 11 and the second electrode layer 22, and between the second via 42 and the dielectric layer 11 and the first electrode layer 21.

That is, the insulating layer 50 may secure insulation between the first via 41 and the second electrode layer 22 and between the second via 42 and the first electrode layer 21, and be formed on a surface of the dielectric layer 11, thereby decreasing parasitic capacitance formed therein.

The insulating layer 50 may use an organic material such as benzocyclobutene (BCB), polyimide, or the like, or an inorganic material such as $SiO_2$, $Si_3N_4$, or the like, and it is preferable that the insulating layer 50 is formed of a material having lower permittivity than that of the material of the dielectric layer in order to increase an insulation property and decrease parasitic capacitance.

The insulating layer 50 may be formed by a chemical vapor deposition (CVD) method capable of forming a stereoscopically complicated shape at a uniform film thickness.

A protection layer 150 may be disposed on an outer surface of the body 110.

The protection layer 150 maybe formed in order to prevent the body 110 and the first and second connection electrodes 131b and 132b from degradation or contamination of materials caused by humidity from the outside and a chemical reaction with oxygen, and damage at the time of mounting.

The protection layer 150 may be formed of a material having high thermal resistance. For example, the protection layer 150 may be formed of an organic thermosetting material or photocurable material such as polyimide.

According to the exemplary embodiment, among the plurality of vias, the first via 41 may connect the first electrode layer(s) 21 and the first electrode pad 131a and penetrate from one surface of the body 110 to a lowermost first electrode layer 21 adjacent to the substrate 10.

Further, among the plurality of vias, the second via 42 may connect the second electrode layer(s) 22 and the second electrode pad 132a and penetrate from one surface of the body 110 to a lowermost second electrode layer 22 adjacent to the substrate 10.

According to the exemplary embodiment, the plurality of vias may have a multi-step shape, that is, a stepped shape, and a width of each of the steps may be increased in a direction away from the substrate towards an upper portion of the body.

The first and second vias 41 and 42 may be manufactured so that the width of each of the steps of the first and second vias 41 and 42 is increased in the direction from the substrate 10 to the upper portion of the body 110, such that the first via 41 may be connected to all first electrode layers 21 disposed in the body 110, and the second via 42 may be connected to all second electrode layers 22 disposed in the body 110.

Further, since the width of each of the steps of the first and second vias 41 and 42 is increased in the direction from the substrate 10 towards the upper portion of the body 110, the insulating layer 50 may be disposed on etched surfaces of the first electrode layer 21 exposed in the first via 41 and etched surfaces of the second electrode layer 22 exposed in the second via 42, and upper surfaces of the first electrode layer 21 may be exposed to the first via 41 while upper surface of the second electrode layer 22 may be exposed to the second via 42.

Since the first via 41 is formed step-wise by repeating the etching plural times up to the first electrode layer 21 to which the via 41 is exposed and has the multi-step shape, the stepped shape, and the width of each of the steps is increased in the direction from the substrate 10 towards the upper portion of the body 110, after the insulating layer is formed. The insulating layer 50 may be disposed on the etched surfaces of the dielectric layers 11 and of the first and second electrode layers 21 and 22, and only the upper surface of the first electrode layer(s) 21 may be exposed to and contact the via 41.

Therefore, all of the first electrode layers 21 may be electrically connected to each other by the first via 41, and electrically connected to the first electrode pad 131a through the first via 41.

Meanwhile, since the second via 42 is formed step-wise by repeating the etching plural times up to the second electrode layer 22 to which the via 42 is exposed and has the multi-step shape, the stepped shape, and the width of each of the steps is increased in the direction from the substrate 10 towards the upper portion of the body 110, after the insulating layer is formed. The insulating layer 50 may be disposed on the etched surfaces of the dielectric layers 11 and of the first and second electrode layers 21 and 22, and only the upper surface of the second electrode layer(s) 22 may be exposed to and contact the via 42.

Therefore, all of the second electrode layers 22 may be electrically connected to each other by the second via 42, and electrically connected to the second electrode pad 132a through the second via 42.

Further, the insulating layer 50 may be disposed between the second electrode layer 22 and the first via 41 and disposed between the first electrode layer 21 and the second via 42.

In detail, the insulating layer 50 may be disposed on etched surfaces of the second electrode layer 22 exposed to the first via 41 and etched surfaces of the first electrode layer 21 exposed to the second via 42.

According to the exemplary embodiment, the first via 41 may be connected to all of the first electrode layers 21 disposed in the body 110, and the second via 42 may be connected to all of the second electrode layers 22 disposed in the body 110.

According to the exemplary embodiment, since the first via 41 is connected to all of the first electrode layers 21 and the second via 42 is connected to all of the second electrode layers 22, even in a case in which one or two or more internal electrodes are not connected to the via (41 or 42) due to a process deviation, there is no problem in forming capacitance.

That is, in a structure in which one via is connected to one internal electrode as in the related art, when the connection is failed, capacitance is not formed, and as a result, capacitance of a capacitor may be decreased.

However, according to the exemplary embodiment, since the first via 41 is connected to all of the first electrode layers 21 and the second via 42 is connected to all of the second electrode layers 22, even if some of the internal electrodes (21 or 22) are not connected to the via (41 or 42), there is no problem in forming capacitance, such that reliability may be excellent.

The number of first vias 41 included in the capacitor may be two or more, and the first vias 41 may have the same depth as each other. In addition, the number of second vias 42 included in the capacitor may be two or more, and the second vias 42 may have the same depth as each other.

That is, each first via 41 may penetrate from one surface of the body 110 to the lowermost first electrode layer 21, and each second via 42 may penetrate from one surface of the body 110 to the lowermost second electrode layer 22. The plurality of first vias 41 may have the same depth as each other, and the plurality of second vias 42 may also have the same depth as each other.

Figure 3:
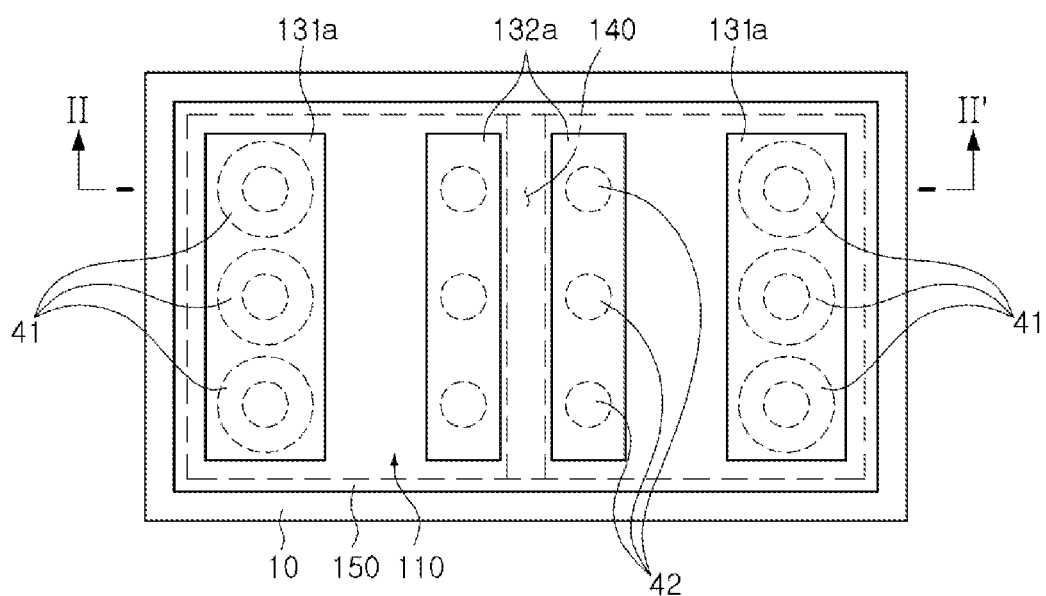
FIG. 3 is a plan diagram illustrating a thin-film ceramic capacitor according to another exemplary embodiment.

FIG. 3 is a plan diagram illustrating a thin-film ceramic capacitor according to another exemplary embodiment.

Figure 4:
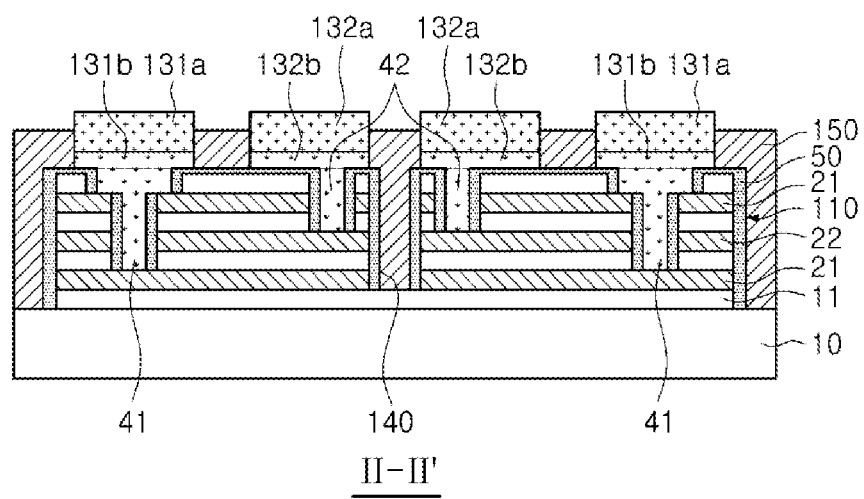
FIG. 4 is a schematic cross-sectional diagram taken along line II-II' of FIG. 3.

FIG. 4 is a schematic cross-sectional diagram taken along line II-II' of FIG. 3.

Referring to FIGS. 3 and 4, in the thin-film ceramic capacitor according to the other exemplary embodiment, a body 110 may have a separation slit 140 as in the thin-film ceramic capacitor shown and described in relation to FIGS. 1 and 2.

The separation slit 140 may penetrate through an upper surface of the body 110 to extend to and expose a substrate 10.

According to another exemplary embodiment, electrode pads 131a may be disposed to be electrically connected to two vias disposed adjacent to both end surfaces of the body 110, respectively, and electrode pads 132a may be disposed to be electrically connected to two vias adjacent to the separation slit 140, respectively.

The two vias adjacent to the separation slit 140 may have a polarity different from the two vias disposed adjacent to both end surfaces of the body 110, and as illustrated in FIG. 4, two vias adjacent to the separation slit 140 may be disposed as the second vias 42, and two vias disposed adjacent to both end surfaces of the body 110 may be disposed as the first vias 41.

Therefore, the electrode pads disposed to be electrically connected to two first vias 41 disposed adjacently to both end surfaces of the body 110, respectively, may be first electrode pads 131a, and the electrode pads disposed to be electrically connected to two second vias 42 adjacent to the separation slit 140 may be the second electrode pads 132a.

Referring to FIG. 4, the second electrode pads 132a disposed to be electrically connected to two second vias 42 adjacent to the separation slit 140 may be disposed as two separate terminals to be connected to two distinct second vias 42, respectively.

In this case, two terminals may be disposed as the second electrode pads 132a, such that the thin-film ceramic capacitor according to the other exemplary embodiment may have a structure of a four-terminal capacitor.

According to another exemplary embodiment, two capacitors may be formed in a land-side capacitor (LSC) and provided as a single capacitor, such that a mounting area at the time of mounting the thin-film ceramic capacitor on a board may be significantly decreased.

More specifically, the thin-film ceramic capacitor according to the other exemplary embodiment may have a structure in which the separation slit 140 is disposed in the body 110 and formed to penetrate through the upper surface of the body 110 and extend to and expose the substrate 10, and the plurality of first and second vias 41 and 42 are disposed symmetrically on opposite sides of the separation slit 140.

Further, the electrode pads of the thin-film ceramic capacitor may be composed of two first electrode pads 131a disposed to be electrically connected to two first vias 41 disposed adjacently to both end surfaces of the body 110, respectively, and two second electrode pads 132a disposed to be electrically connected to two second vias 42 adjacent to the separation slit 140, respectively.

Here, the first electrode pads 131a may serve as signal terminals, and the second electrode pads 132a may serve as ground terminals.

According to the other exemplary embodiment, since two capacitors may be completely separated from each other to thereby function independently, even though different signals are received in two signal terminals, the two signals do not affect each other such that the thin-film ceramic capacitor may execute proper functions as two capacitors operating separately.

Therefore, since two capacitors to be mounted on the substrate 10 maybe implemented within a same capacitor body mounted on a board, a board mounting area may be substantially decreased.

Further, two second electrode pads may be connected to each other or separated from each other to thereby be used as a single or as two separate terminals depending on a solder application method at the time of mounting the thin-film ceramic capacitor on the board.

In this case, as two second electrode pads are completely separated from each other, if necessary, the thin-film ceramic capacitor may be used as two separate capacitors.

Figure 5:
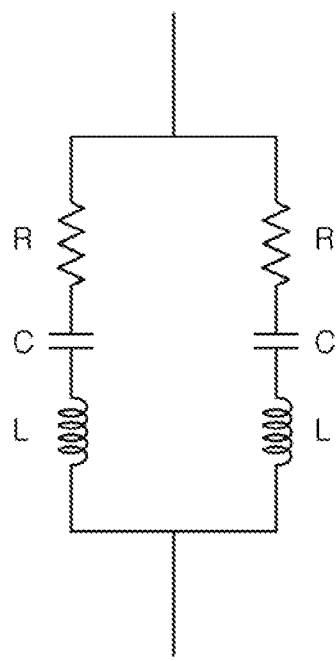
FIG. 5 is a schematic equivalent circuit diagram of the thin-film ceramic capacitor according to the exemplary embodiment.

FIG. 5 is a schematic equivalent circuit diagram of the thin-film ceramic capacitor according to the exemplary embodiment.

In the thin-film ceramic capacitor according to the exemplary embodiment, when two signal terminals disposed adjacent to both end surfaces of the body are connected to each other and used in parallel as in the three-terminal capacitor according to the related art, capacitors, inductor, and resistors forming the equivalent circuit may be connected to one another in parallel.

Referring to FIG. 5, in a case in which two signal terminals are connected to each other as described above, ESL and ESR may be decreased due to the parallel connection between inductors and resistors.

Hereinafter, various Inventive Examples for manufacturing the thin-film ceramic capacitor according to the exemplary embodiment will be described, but a method of manufacturing the thin-film ceramic capacitor is not limited thereto.

FIGS. 6A through 6H are diagrams illustrating a process for manufacturing the thin-film ceramic capacitor according to the exemplary embodiment.

Hereinafter, a method of manufacturing vias in the thin-film ceramic capacitor will be described with reference to FIGS. 6A through 6H.

Figure 6A:
FIGS. 6A through 6H are diagrams illustrating steps of an illustrative process for manufacturing the thin-film ceramic capacitor according to the exemplary embodiment.
Figure 6B:
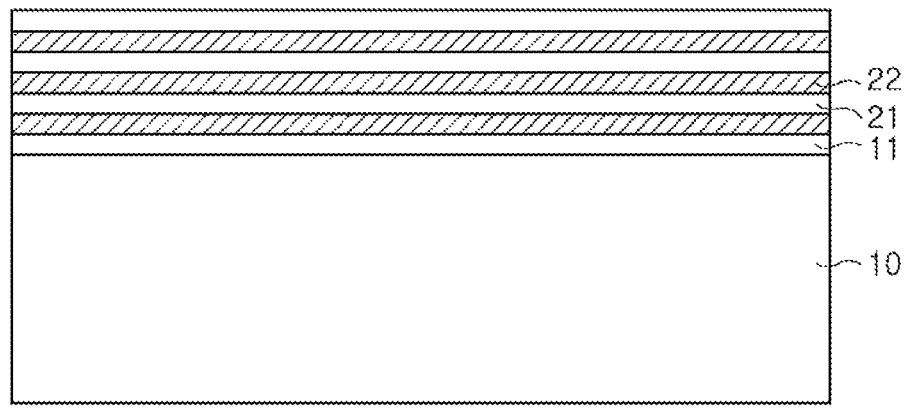

Referring to FIGS. 6A and 6B, a laminate may be prepared by preparing Si wafer, disposing a substrate 10 on the Si wafer, and stacking first and second electrode layers 21 and 22 and dielectric layers 11 on the substrate 10 so as to be alternately disposed. In particular, the first and second electrode layers 21 and 22 may be alternately disposed in the stack, and a dielectric layer 11 may be interposed between each pair of adjacent first and second electrode layers 21 and 22. A dielectric layer 11 may further be disposed between the substrate 10 and the bottom-most layer among the first and second electrode layer 21 and 22.

The substrate 10 is not particularly limited. For example, the substrate may be a layer made of $SiO_2$.

The first electrode layer 21 may be formed by depositing a conductive metal using a thin film formation method such as a sputtering method, an E-beam deposition method, or the like. The dielectric layer 11 may be formed by depositing a perovskite-based dielectric material such as barium titanate ($BaTiO_3$), or the like, on the first electrode layer 21. The second electrode layer 22 may be formed on the dielectric layer 11.

Therefore, a plurality of first and second electrode layers 21 and 22 may be formed to be alternately stacked through both end surfaces of the dielectric layers 11 opposing each other.

The stacking of the dielectric layers 11 and the first and second electrode layers 21 and 22 may be performed by a deposition method, but is not limited thereto. That is, the stacking may also be performed by a chemical solution deposition (CSD) method.

The dielectric layers 11 and the first and second electrode layers 21 and 22 may be stacked simultaneously without a separate patterning process.

Figure 6C:
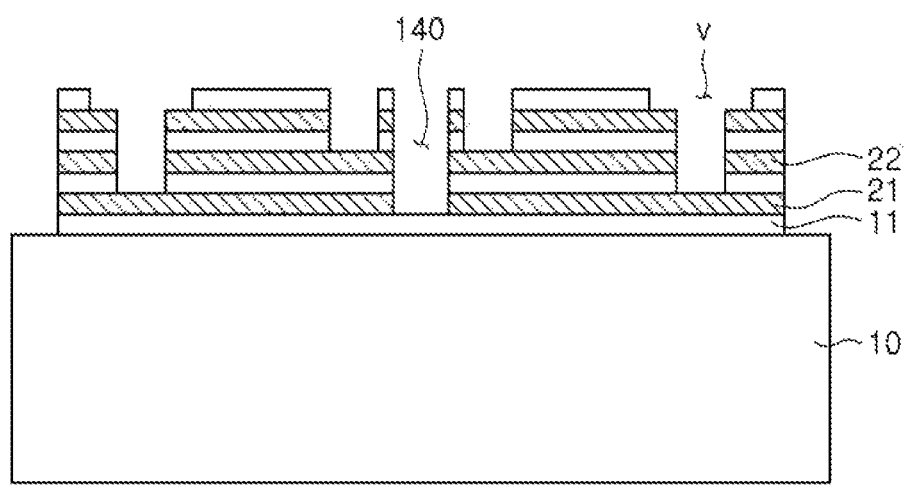

Referring to FIG. 6C, in order to provide interlayer electrodes disposed in the laminate, a photoresist may be applied to an upper surface of the laminate, and the photoresist may be patterned by an exposure and development method (not illustrated).

Referring to FIG. 6C, via holes v may be formed by etching through the laminate to a predetermined electrode layer.

The via holes v illustrated in FIG. 6C may become first and second visas 41 and 42 after being filled with a conductive metal as described below. The via holes v may be formed by etching to the bottom-most first and second electrode layers 21 and 22 in the stack (e.g., first and second electrode layers 21 and 22 adjacent to or closest to an upper surface of the substrate 10) so as to extend between the bottom-most and upper-most first and second electrode layers 21 and 22.

Further, a separation slit 140 may be formed to penetrate from the upper surface of body 110 and expose the substrate 10, and the first and second vias 41 and 42 may be disposed symmetrically on either side of the separation slit 140.

In detail, the plurality of second vias 42 may be disposed on both sides of the separation slit 140 to be adjacent to the separation slit 140, and the first vias 41 may be disposed adjacently to both end surfaces of the body 110, respectively. Alternatively, the first vias 41 may be disposed on both sides of the separation slit 140 to be adjacent to the separation slit 140, and the second vias 42 may be disposed adjacently to both end surfaces of the body 110, respectively.

According to the exemplary embodiment, the vias may be formed to have a multi-step shape, that is, a stepped shape, by performing interlayer etching while changing an etching area in order to selectively connect internal electrodes of the thin-film ceramic capacitor stacked simultaneously.

Each of the vias may be formed to have a width narrower than that of a via disposed thereabove and in contact therewith.

Figure 6D:
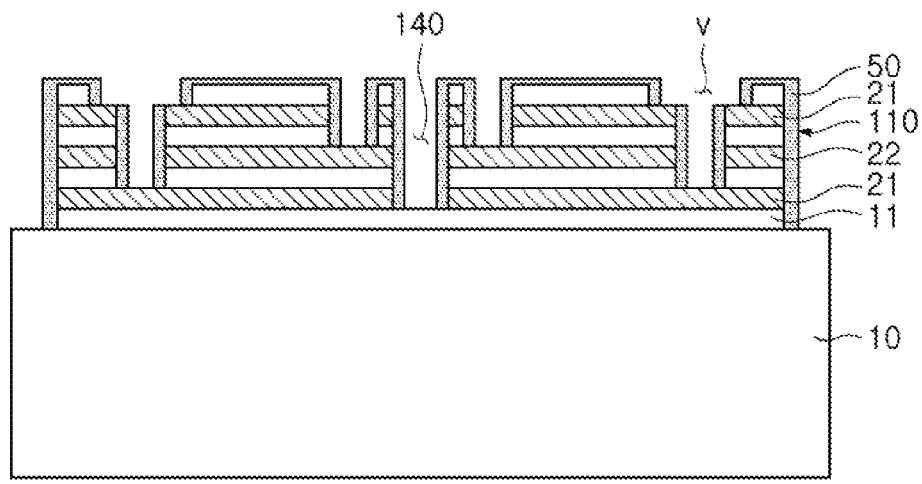

Referring to FIG. 6D, a method of patterning an insulating layer 50 in order to selectively connect exposed electrodes is illustrated.

The insulating layer 50 may be formed on edge surfaces of internal electrodes to be insulated from vias etched in the stepped shape and contacting the edge surfaces, thereby blocking electrical connection to the vias.

That is, while the first via 41 generally needs to be connected to the first electrode layer 21, it should be simultaneously insulated from the exposed second electrode layer 22. Similarly, while the second via 42 needs to be connected to the second electrode layer 22, it should be simultaneously insulated from the exposed first electrode layer 21.

Therefore, there is a need to block an electrical connection between the first via(s) 41 and the second electrode layer(s) 22 and between the second via(s) 42 and the first electrode layer(s) 21 by a dielectric layer or an insulating layer.

In a method of patterning the insulating layer 50 in order to selectively connect the exposed electrodes, first, an insulating material is applied to an upper portion of the substrate and the entire laminate.

Next, the insulating layer 50 may be formed in the plurality of vias by etching the insulating material.

The insulating layer 50 may be formed on etched edge surfaces of the dielectric layers 11 and of the first and second electrode layers 21 and 22 in the plurality of vias.

Since the width of each of the steps of the first and second vias 41 and 42 is increased in the direction from the substrate 10 to the upper portion of the laminate, the insulating layer 50 may be disposed on etched edge surfaces of the first electrode layer 21 exposed in the first via 41 and of the second electrode layer 22 exposed in the second via 42. Upper surfaces of the first electrode layer 21 may be exposed in the first via 41, and upper surfaces of the second electrode layer 22 may be exposed in the second via 42.

Further, since the first via 41 is formed by repeating the etching a plurality of times until the via extends to the bottom-most first electrode layer 21 and has the multi-step shape (e.g., the stepped shape), and since the width of each of the steps is increased in the direction from the substrate to the upper portion of the laminate, the insulating layer 50 may be disposed on the etched edge surfaces of the dielectric layers 11 and of the first and second electrode layers 21 and 22. As such, only the upper surfaces of the first electrode layers 21 may be exposed to the first via 41 and may not have the insulating layer 50 disposed thereon.

Meanwhile, since the second via 42 is formed by repeating the etching a plurality of times until the via extends to the bottom-most second electrode layer 22 and has the multi-step shape (e.g., the stepped shape), and since the width of each of the steps is increased in the direction from the substrate to the upper portion of the laminate, the insulating layer 50 may be disposed on the etched edge surfaces of the dielectric layers 11 and of the first and second electrode layers 21 and 22. As such, only the upper surface(s) of the second electrode layer(s) 22 may be exposed to the second via 42 and may not have the insulating layer 50 disposed thereon.

According to the exemplary embodiment, the first via 41 may be connected to and contact all of the first electrode layers 21 disposed in the laminate, and the second via 42 may be connected to and contact all of the second electrode layers 22 disposed in the laminate.

The number of first vias 41 may be two or more, and each of the plurality of first vias 41 may have the same depth as the others. In addition, the number of second vias 42 may be two or more, and each of the plurality of second vias 42 may have the same depth as the others.

Figure 6E:
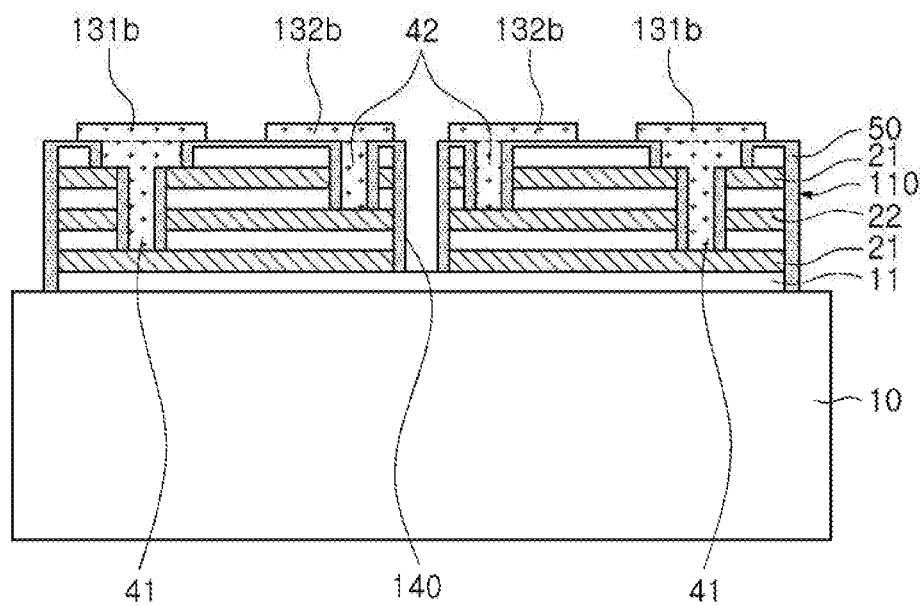

Referring to FIG. 6E, the first and second vias 41 and 42 may be formed by filling the conductive metal in the via holes.

A method of filling the conductive metal in the via holes may be performed by forming a seed layer on a surface of each of the exposed electrode layers and then filling the conductive metal using a plating method so as to connect the electrode layers and external electrodes to each other.

The first and second vias 41 and 42 may be formed by filling the vias holes with the conductive metal, such that the first and second electrode layers 21 and 22 and the first and second electrode pads 131*a* and 132*a* may be electrically connected to each other, respectively.

Further, the first and second connection electrodes 131*b* and 132*b* may be formed on the upper surface of the laminate by the method of filling the conductive metal.

Figure 6F:
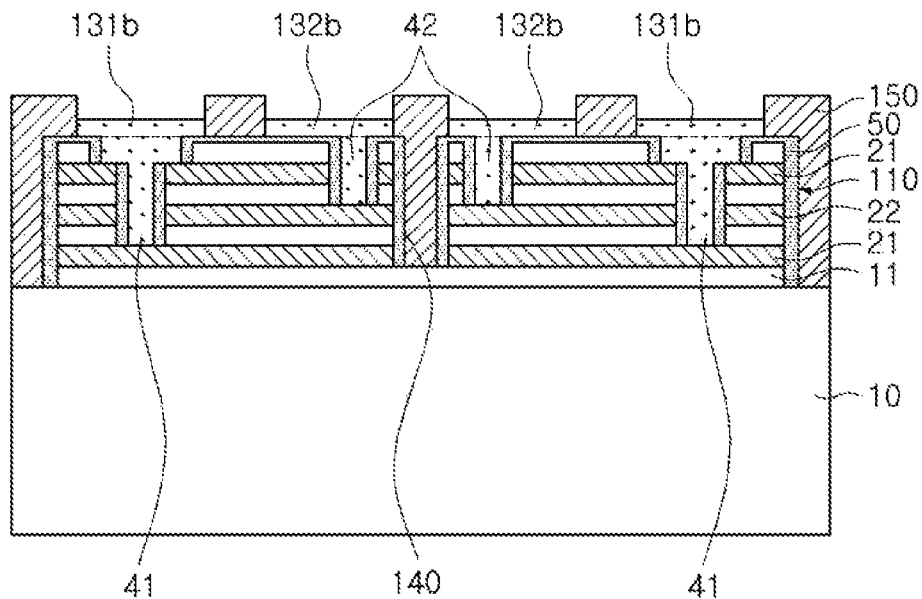

Referring to FIG. 6F, a protection layer 150 may be disposed on an outer surface of the laminate.

The protection layer 150 maybe formed in order to prevent the body 110 and the first and second connection electrodes 131*b* and 132*b* from degradation or contamination of materials caused by external humidity and a chemical reaction with oxygen, and damage at the time of mounting.

The protection layer 150 may be formed of a material having high thermal resistance. For example, the protection layer 150 may be formed of an organic thermosetting material or photocurable material such as polyimide.

The protection layer 150 may also be disposed in the separation slit 140.

Figure 6G:
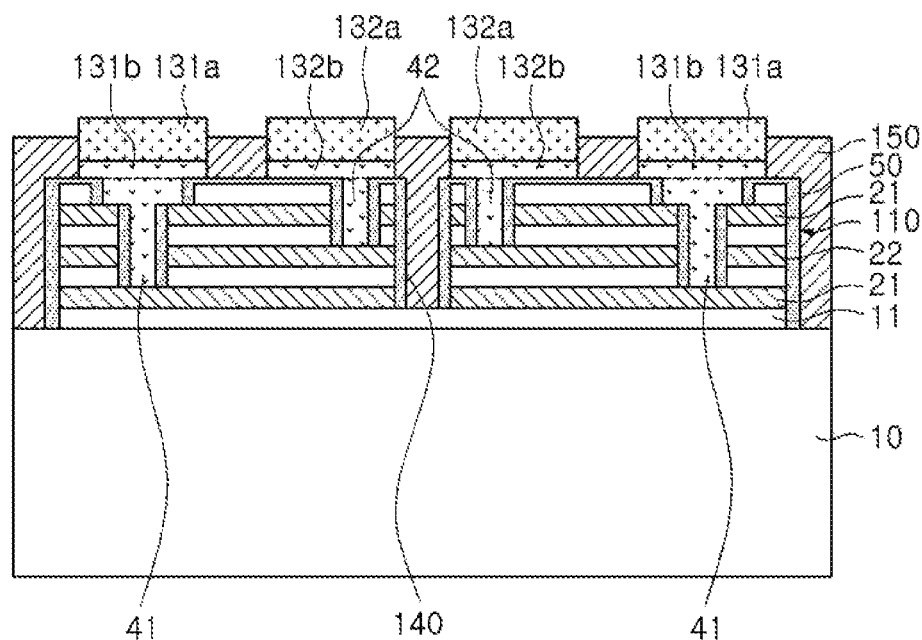

Referring to FIG. 6G, the first and second electrode pads 131*a* and 132*a* may be formed on the upper surface of the laminate.

The first and second electrode pads 131*a* and 132*a* may be connected to the first and second electrode layers through the plurality of vias exposed to one surface of the laminate to thereby be electrically connected thereto.

The first and second electrode pads 131*a* and 132*a* as described above may be formed on the upper surface of the laminate by a thin film formation method such as a sputtering method or an e-beam deposition method.

The first and second electrode pads 131*a* and 132*a* may contain a conductive material.

The conductive material may be copper (Cu), aluminum (Al), gold (Au), silver (Ag), platinum (Pt), or the like, but is not limited thereto.

The first and second electrode pads 131*a* and 132*a* may include seed layers and electrode layers formed from the seed layers, respectively.

Figure 6H:
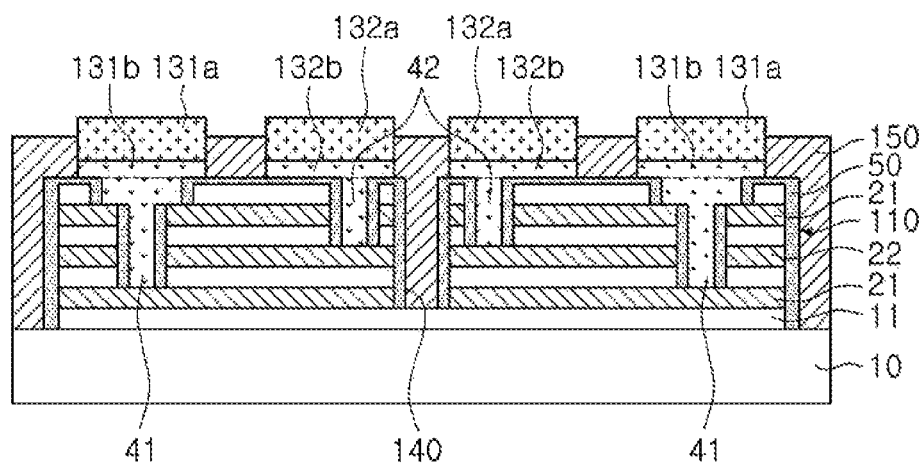

Referring to FIG. 6H, the first electrode pad 131*a* may be connected to two first vias 41 disposed adjacently to the end surfaces of the laminate, respectively, to thereby serve as the signal terminal, and the second electrode pad 132*a* may be connected to two second vias 42 disposed adjacently to the separation slit 140. In a case in which one electrode pad is disposed to cover the separation slit 140 while simultaneously connecting two second vias 42, the thin-film ceramic capacitor may have a structure of the three-terminal thin-film ceramic capacitor, and the second electrode pad 132*a* may serve as the ground terminal.

Meanwhile, two separate second electrode pads 132*a* may be formed to be connected to two separate second vias 42, respectively, as shown in FIG. 6H. In this case, the second electrode pads 132*a* may serve as ground terminals, respectively, or serve as a single integrated terminal depending on a solder ball formation method.

The first and second electrode pads 131*a* and 132*a* may be integrated with the first and second connection electrodes 131*b* and 132*b*. Alternatively, the first and second electrode pads 131*a* and 132*a* may be disposed on the first and second connection electrodes 131*b* and 132*b*.

As set forth above, according to exemplary embodiments, the dielectric layers and electrodes may be stacked simultaneously. Afterwards, the electrodes may be electrically connected to each other by the vias having the multi-step shape, such that damage caused by external environments may be significantly decreased, and a small-sized product having a reduced thickness may be implemented.

Further, since all layers requiring electrical connection may be entirely connected to each other through one via, a total device area used by vias may be significantly decreased, such that capacitance may be increased.

In addition, since a product structure may be simplified by patterning the insulating layer 50 in the vias, the number of stacked electrode layers in the thin-film ceramic capacitor may be increased, such that high capacitance may be implemented.

Further, the thin-film capacitor according to the exemplary embodiment may have low equivalent series inductance (ESL) and low equivalent series resistance (ESR).

In addition, the three-terminal thin-film ceramic capacitor in which two capacitors are formed and three terminal electrodes are disposed in a land-side capacitor may be provided, such that the mounting surface at the time of mounting the thin-film ceramic capacitor on the board may be significantly decreased.

While exemplary embodiments have been shown and described above, it will be apparent to those skilled in the art that modifications and variations could be made without departing from the scope of the present invention as defined by the appended claims.

What is claimed is:

1. A thin-film ceramic capacitor comprising:
a body in which a plurality of dielectric layers and first and second electrode layers are alternately disposed on a substrate;
first to third electrode pads disposed on an upper surface of the body;
first to fourth vias disposed in the body;
a separation slit penetrating from the upper surface of the body and extending toward the substrate to separate the body into a first portion having the first and second vias and a second portion having the third and fourth vias; and
an insulating protection layer filling the separation slit to separate the first portion and the second from each other,
wherein the second electrode pad is disposed between the first and third electrode pads,
wherein the second via is disposed between the first via and the separation slit, and the third via is disposed between the separation slit and the fourth via,
wherein the first via connects the first electrode layers in the first portion and the first electrode pad to each other and penetrates from the upper surface of the body to a lowermost first electrode layer adjacent to the substrate,
wherein the second via connects the second electrode layers in the first portion and the second electrode pad to each other and penetrates from the upper surface of the body to a lowermost second electrode layer adjacent to the substrate,
wherein the third via connects the second electrode layers in the second portion and the second electrode pad to each other and penetrates from the upper surface of the body to the lowermost second electrode layer adjacent to the substrate, and
wherein the fourth via connects the first electrode layers in the second portion and the third electrode pad to each other and penetrates from the upper surface of the body to the lowermost first electrode layer adjacent to the substrate.

2. The thin-film ceramic capacitor of claim 1, wherein the first via is connected to all of the first electrode layers disposed in the first portion of the body, and the fourth via is connected to all of the first electrode layers disposed in the second portion of the body.

3. The thin-film ceramic capacitor of claim 2, wherein the second via is connected to all of the second electrode layers disposed in the first portion of body, and the third via is connected to all of the second electrode layers disposed in the second portion of the body.

4. The thin-film ceramic capacitor of claim 1, further comprising:
a plurality of fifth vias having the same depth as the first via; and
a plurality of sixth vias having the same depth as the fourth via,
wherein the first to fourth vias are sequentially arranged along a first direction,
wherein the first via and the plurality of fifth vias are arranged along a second direction different from the first direction and are connected to the first electrode pad, and
wherein the fourth via and the plurality of sixth vias are arranged along the second direction and are connected to the third electrode pad.

5. The thin-film ceramic capacitor of claim 4, further comprising:
a plurality of seventh vias having the same depth as the second via; and
a plurality of eighth vias having the same depth as the third via,
wherein the second via and the plurality of seventh vias are arranged along the second direction and are connected to the second electrode pad, and
the third via and the plurality of eighth vias are arranged along the second direction and are connected to the second electrode pad.

6. The thin-film ceramic capacitor of claim 1, further comprising:
a first insulating layer disposed between edge surfaces of the second electrode layers and the first via,
a second insulating layer disposed between edge surfaces of the first electrode layers and the second via,
a third insulating layer disposed between edge surfaces of the first electrode layers and the third via,
a fourth insulating layer disposed between edge surfaces of the second electrode layers and the fourth via.

7. The thin-film ceramic capacitor of claim 1, wherein portions of upper surfaces of the first electrode layers are exposed to the first and fourth vias, and portions of upper surfaces of the second electrode layers are exposed to the second and third vias.

8. The thin-film ceramic capacitor of claim 1, wherein the second electrode pad covers the separation slit.

9. The thin-film ceramic capacitor of claim 1, wherein each of the first to fourth vias has a multi-step shape, and a width of each of the steps of the first to fourth vias is increased in a direction from the substrate towards an upper portion of the body.

10. A thin-film ceramic capacitor comprising:
a body in which a plurality of dielectric layers and first and second electrode layers are alternately disposed on a substrate; and
first to fourth electrode pads disposed on an upper surface of the body;
first to fourth vias disposed in the body;
a separation slit penetrating from the upper surface of the body and extending to the substrate to separate the body into a first portion having the first and second vias and a second portion having the third and fourth vias; and
a protection layer, made of a same material, filling the separation slit and extending continuously from the separation slit to be in contact with side surfaces of the second and third electrode pads to separate the second and third electrode pads from each other,
wherein the first and second electrode pads, and the third and fourth electrode pads are disposed on opposite sides of the separation slit, the second electrode pad is disposed between the first electrode pad and the separation slit, and the third electrode pad is disposed between the separation slit and the fourth electrode pad,
wherein the second via is disposed between the first via and the separation slit, and the third via is disposed between the separation slit and the fourth via, wherein the first via connects the first electrode layers in the first portion and the first electrode pad to each other and penetrates from the upper surface of the body to a lowermost first electrode layer adjacent to the substrate, wherein the second via connects the second electrode layers in the first portion and the second electrode pad to each other and penetrates from the upper surface of the body to a lowermost second electrode layer adjacent to the substrate, wherein the third via connects the second electrode layers in the second portion and the third electrode pad to each other and penetrates from the upper surface of the body to the lowermost second electrode layer adjacent to the substrate, and wherein the fourth via connects the first electrode layers in the second portion and the fourth electrode pad to each other and penetrates from the upper surface of the body to the lowermost first electrode layer adjacent to the substrate.

11. The thin-film ceramic capacitor of claim 10, wherein the first via is connected to all of the first electrode layers disposed in the first portion of the body, and the fourth via is connected to all of the first electrode layers disposed in the second portion of the body.

12. The thin-film ceramic capacitor of claim 11, wherein the second via is connected to all of the second electrode layers disposed in the first portion of body, and the third via is connected to all of the second electrode layers disposed in the second portion of the body.

13. The thin-film ceramic capacitor of claim 10, further comprising:
- a plurality of fifth vias having the same depth as the first via;
- a plurality of sixth vias having the same depth as the second via;
- a plurality of seventh vias having the same depth as the third via; and
- a plurality of eighth vias having the same depth as the fourth via, wherein the first to fourth vias are sequentially arranged in a first direction, wherein the first via and the plurality of fifth vias are arranged along a second direction different from the first direction and are connected to the first electrode pad, and wherein the second via and the plurality of sixth vias are arranged along the second direction and are connected to the second electrode pad, wherein the third via and the plurality of seventh vias are arranged along the second direction and are connected to the third electrode pad, and wherein the fourth via and the plurality of eighth vias are arranged along the second direction and are connected to the fourth electrode pad.

14. The thin-film ceramic capacitor of claim 10, further comprising:
- a first insulating layer disposed between edge surfaces of the second electrode layers and the first via,
- a second insulating layer disposed between edge surfaces of the first electrode layers and the second via,
- a third insulating layer disposed between edge surfaces of the first electrode layers and the third via,
- a fourth insulating layer disposed between edge surfaces of the second electrode layers and the fourth via.

15. The thin-film ceramic capacitor of claim 10, wherein portions of upper surfaces of the first electrode layers are exposed to the first and fourth vias, and portions of upper surfaces of the second electrode layers are exposed to the second and third vias.

16. The thin-film ceramic capacitor of claim 10, wherein each of the first to fourth vias has a multi-step shape, and a width of each of the steps of the first to fourth vias is increased in a direction from the substrate towards an upper portion of the body.

* * * * *